US011465225B1

(12) United States Patent
Jing et al.

(10) Patent No.: US 11,465,225 B1
(45) Date of Patent: Oct. 11, 2022

(54) METHOD OF USING PROCESSING OVEN

(71) Applicant: Yield Engineering Systems, Inc., Fremont, CA (US)

(72) Inventors: Lei Jing, Santa Clara, CA (US); M Ziaul Karim, San Jose, CA (US); Kenneth Sautter, Sunnyvale, CA (US); Kang Song, San Jose, CA (US)

(73) Assignee: YIELD ENGINEERING SYSTEMS, INC., Freemont, CA (US)

( * ) Notice: Subject to any disclaimer, the term of this patent is extended or adjusted under 35 U.S.C. 154(b) by 0 days.

(21) Appl. No.: 17/692,760

(22) Filed: Mar. 11, 2022

Related U.S. Application Data

(63) Continuation-in-part of application No. 17/463,012, filed on Aug. 31, 2021, now Pat. No. 11,296,049.

(51) Int. Cl.
*B23K 1/015* (2006.01)
*B23K 1/008* (2006.01)
(Continued)

(52) U.S. Cl.
CPC .............. *B23K 1/015* (2013.01); *B23K 1/008* (2013.01); *B23K 3/085* (2013.01); *H01L 24/742* (2013.01); *H01L 24/75* (2013.01); *B23K 1/0016* (2013.01); *B23K 1/012* (2013.01); *B23K 2101/40* (2018.08); *B23K 2101/42* (2018.08); *H01L 2021/60007* (2013.01); *H01L 2021/6027* (2013.01); *H01L 2021/60135* (2013.01); *H01L 2224/75272* (2013.01); *H01L 2224/75283* (2013.01)

(58) Field of Classification Search
CPC ................... H01L 24/75; H01L 24/752; H01L 2224/75272; H01L 2224/75283; H01L 2021/60007; H01L 2021/6027; H01L 2021/60135; B23K 1/0016; B23K 1/008; B23K 1/012; B23K 1/015; B23K 2101/40; B23K 2101/42
See application file for complete search history.

(56) References Cited

U.S. PATENT DOCUMENTS 5,046,658 A * 9/1991 Morris ............... B23K 35/3618
228/206
8,252,678 B2 * 8/2012 Zhang ..................... H01L 24/75
438/615
(Continued)

*Primary Examiner* — David A Zarneke
(74) *Attorney, Agent, or Firm* — Finnegan, Henderson, Farabow, Garrett & Dunner, LLP

(57) ABSTRACT

A method of using a solder reflow oven can include disposing at least one substrate including solder in a chamber of the oven. The method can include decreasing a pressure of the chamber to a first pressure between about 0.1-50 Torr. After decreasing the pressure of the chamber, the temperature of the at least one substrate can be increased to a first temperature. Formic acid vapor can be admitted into the chamber above the at least one substrate while nitrogen is discharged into the chamber below the at least one substrate. The method can also include removing at least a portion of the formic acid vapor from the enclosure. After the removing step, the temperature of the at least one substrate can be further increased to a second temperature higher than the first temperature. The at least one substrate can be maintained at the second temperature for a first time. And then, the at least one substrate can be cooled.

18 Claims, 16 Drawing Sheets

(51) Int. Cl.
*B23K 3/08* (2006.01)
*H01L 23/00* (2006.01)
*B23K 101/42* (2006.01)
*B23K 101/40* (2006.01)
*B23K 1/012* (2006.01)
*H01L 21/60* (2006.01)
*B23K 1/00* (2006.01)

(56) References Cited

U.S. PATENT DOCUMENTS

| | | | | |
|---|---|---|---|---|
| 9,682,438 B2 * | 6/2017 | Oyama | ......... | B23K 1/012 |
| 9,773,744 B2 * | 9/2017 | Willeke | ......... | B23K 1/206 |
| 10,875,114 B2 * | 12/2020 | Nagai | ......... | B23K 1/0016 |
| 2013/0175323 A1 * | 7/2013 | Zhang | ......... | B23K 1/0016 |
| | | | | 228/4.1 |

* cited by examiner

METHOD OF USING PROCESSING OVEN

CROSS REFERENCES TO RELATED APPLICATIONS

The present application is a continuation-in-part of U.S. patent application Ser. No. 17/463,012, filed Aug. 31, 2021, which is incorporated herein by reference in its entirety.

TECHNICAL FIELD

The present disclosure relates to a method of using a processing oven.

BACKGROUND

The drive towards smaller and less expensive electronic devices has driven the development of advanced semiconductor packaging technologies. Semiconductor packaging technologies use solder joints to form several interfaces. For instance, in some electronic packages, wires attached using solder (called wire bonds) or flip-chip solder bumps (called controlled collapse chip or C4 connection) are used to electrically connect (i.e., interconnect) a semiconductor die (or IC chip) to a substrate. In some cases, the die-substrate assembly may also be interconnected to other substrates or interposers (e.g., printed circuit board, etc.) using solder joints or solder bumps (called a ball grid array connection). To form such interconnections, a solder material is reflowed to complete the interconnect.

Conventionally, solder reflow is accomplished by passing the assembly (die-substrate assembly, wafers, etc.) through a batch reflow oven in which the assembly passes through different zones of the oven on a conveyor belt. Different zones preferably are maintained at different temperatures. As the assembly passes through the different zones, it is heated and cooled such that the assembly is subjected to a reflow temperature profile. A chemical vapor (e.g., a flux vapor) at atmospheric pressure may also be introduced into the oven at one or more zones to assist with the reflow process. Introducing chemical vapor for solder reflow at atmospheric pressure is not optimal for small solder geometries because atmospheric pressure may provide a competing force to the chemical vapor pressure and hinder the vapor from reaching all regions of the solder bumps during reflow. As a result, solder yield may be reduced. As semiconductor technology advances, the solder bumps are becoming too small for batch thermal reflow systems to achieve desirable solder yield. Small solder bumps on devices require more precise thermal process control and chemical vapor delivery to enable reflow with high yield. The processing ovens and solder reflow methods of the current disclosure may alleviate one or more of the above-described issues.

SUMMARY

Several embodiments of a solder reflow oven (or a processing oven) and methods of using the oven are disclosed. It is to be understood that both the foregoing general description and the following detailed description are exemplary and explanatory only. As such, the scope of the disclosure is not limited solely to the disclosed embodiments. Instead, it is intended to cover such alternatives, modifications, and equivalents within the spirit and scope of the disclosed embodiments. Persons skilled in the art would understand how various changes, substitutions and alterations can be made to the disclosed embodiments without departing from the spirit and scope of the disclosure.

In one aspect, a method of using a solder reflow oven is disclosed. The method may include disposing at least one substrate including solder in a chamber of the oven. The method may also include decreasing a pressure of the chamber to a first pressure between about 0.1-50 Torr. After decreasing the pressure of the chamber, the temperature of the at least one substrate may be increased to a first temperature. Formic acid vapor may be admitted into the chamber above the at least one substrate while nitrogen is admitted into the chamber below the at least one substrate. The method may also include removing at least a portion of the formic acid vapor from the enclosure. After the removing step, the temperature of the at least one substrate may be further increased to a second temperature higher than the first temperature. The at least one substrate may be maintained at the second temperature for a first time. And then, the at least one substrate may be cooled.

Various embodiments of the oven may alternatively or additionally include one or more of the following features: increasing the temperature may include increasing the temperature of the at least one substrate using a lamp assembly disposed in the chamber above the at least one substrate; further increasing the temperature may include further increasing the temperature of the at least one substrate using a lamp assembly disposed in the chamber above the at least one substrate; increasing the temperature may include increasing the temperature of the at least one substrate to a temperature between about 150° C.-180° C.; further increasing the temperature may include increasing the temperature of the at least one substrate to a temperature between about 220° C.-250° C.; admitting formic acid vapor into the chamber may include admitting formic acid vapor having a formic acid concentration between about 3-15% into the chamber; admitting formic acid vapor into the chamber may include admitting formic acid vapor into the chamber from a source that is adapted to vary a concentration of formic acid in the formic acid vapor; admitting formic acid vapor into the chamber may include admitting formic acid vapor into the chamber from a bubbler; cooling the at least one substrate may include cooling the at least one substrate to a temperature between about 15° C.-30° C.

Various embodiments of the oven may alternatively, or additionally, include one or more of the following features: the first time is between about 0.5 minutes to 4 minutes; admitting formic acid vapor into the chamber may include admitting formic acid vapor into the chamber while the at least one substrate is rotating in the chamber; the method may further include lowering the at least one substrate in the chamber to a dosing zone after increasing the temperature of the at least one substrate and before admitting formic acid vapor into the chamber; cooling the at least one substrate may include lowering the at least one substrate in the chamber to contact a cold plate of the chamber; the method may further include directing a liquid coolant through the cold plate to assist in cooling the at least one substrate; cooling the at least one substrate may include lowering the at least one substrate in the chamber to a cool-down zone of the chamber and directing an inert gas on the at least one substrate to assist in cooling the at least one substrate; admitting formic acid vapor into the chamber may include admitting formic acid vapor into the chamber through a chemical delivery tube positioned proximate a top surface of the chamber; and the chemical delivery tube may comprises one of (i) a straight tube that extends from a side of the chamber towards a center of the chamber, (ii) a tube that includes one or more angled portions, or (iii) a T-shaped tube.

BRIEF DESCRIPTION OF THE DRAWINGS

The accompanying drawings, which are incorporated in and constitute a part of this disclosure, illustrate exemplary embodiments and, together with the description, are used to explain the disclosed principles. In these drawings, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure of the various described embodiments. Details of well-known components or features may be omitted to avoid obscuring other features, since these omitted features are well-known to those of ordinary skill in the art. Further, elements in the figures are not necessarily drawn to scale. The dimensions of some features may be exaggerated relative to other features to improve understanding of the exemplary embodiments. One skilled in the art would appreciate that the features in the figures are not necessarily drawn to scale and, unless indicated otherwise, should not be viewed as representing proportional relationships between different features in a figure. Additionally, even if it is not specifically mentioned, aspects described with reference to one embodiment or figure may also be applicable to, and may be used with, other embodiments or figures.

DETAILED DESCRIPTION

All relative terms such as "about," "substantially," "approximately," etc., indicate a possible variation of ±10% (unless noted otherwise or another variation is specified). For example, a feature disclosed as being about "t" units long (wide, thick, etc.) may vary in length from (t−0.1t) to (t+0.1t) units. Similarly, a temperature within a range of about 100-150° C. can be any temperature between (100−10%) and (150+10%). In some cases, the specification also provides context to some of the relative terms used. For example, a structure described as being substantially circular or substantially cylindrical may deviate slightly (e.g., 10% variation in diameter at different locations, etc.) from being perfectly circular or cylindrical. Further, a range described as varying from, or between, 5 to 10 (5-10), includes the endpoints (i.e., 5 and 10).

Unless otherwise defined, all terms of art, notations, and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein as being incorporated by reference are incorporated by reference in their entirety. If a definition or description set forth in this disclosure is contrary to, or otherwise inconsistent with, a definition and/or description in these references, the definition and/or description set forth in this disclosure controls over those in the references that are incorporated by reference. None of the references described or referenced herein is admitted as prior art to the current disclosure.

Figure 1A:
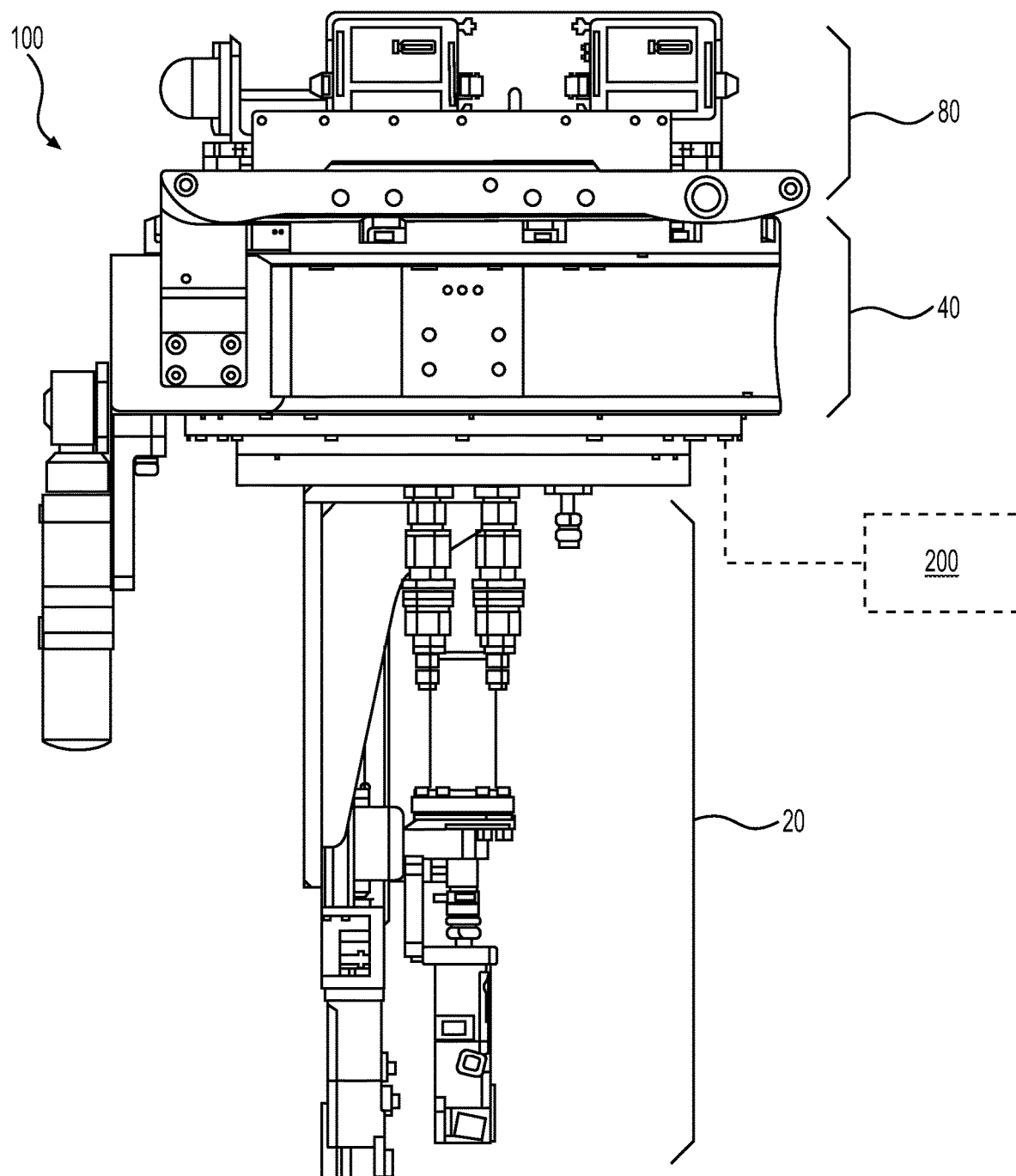
FIGS. 1A and 1B illustrate an exemplary processing oven of the current disclosure.
Figure 1B:
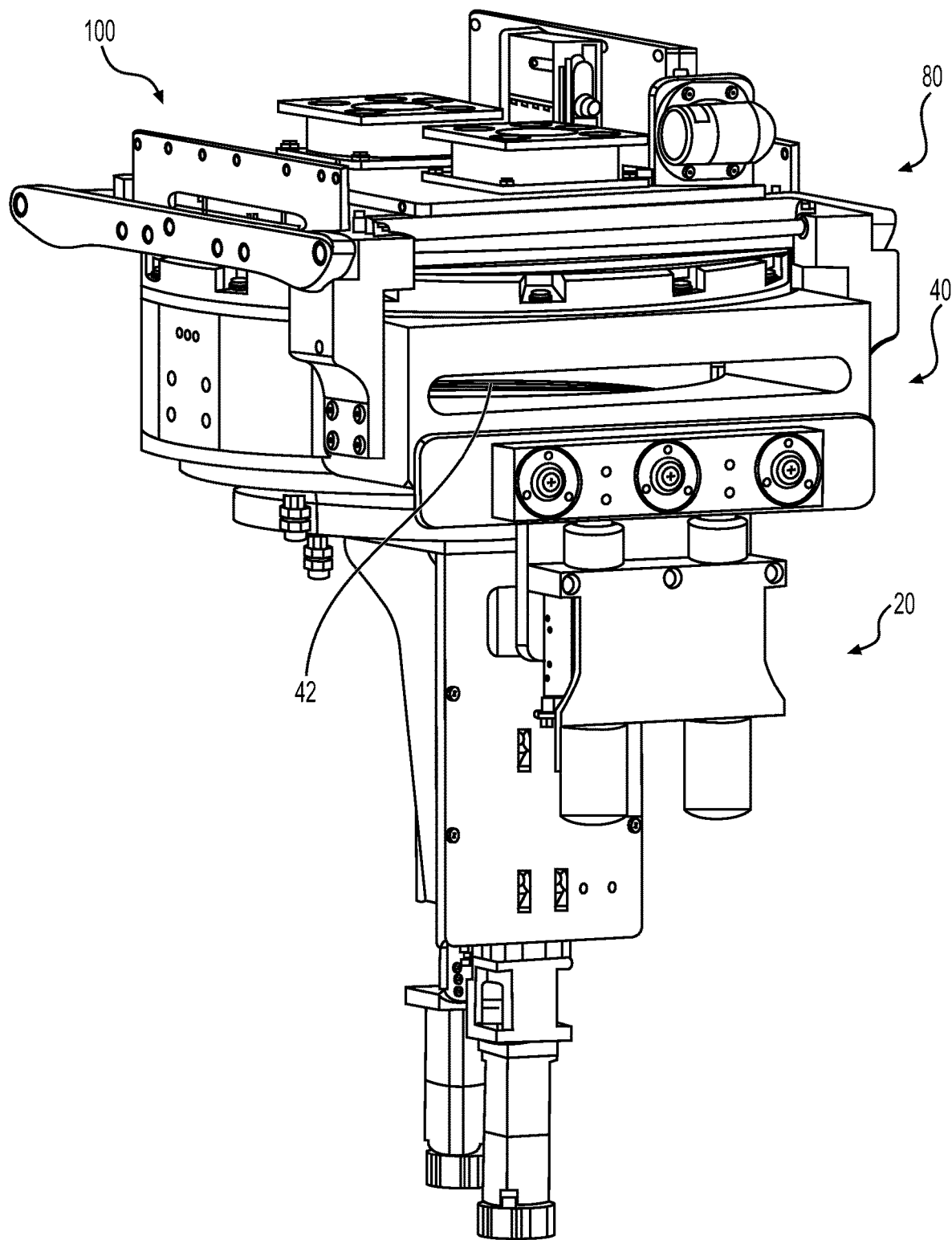

FIG. 1A is a side view and FIG. 1B is a perspective view of an exemplary processing oven (oven 100) of the current disclosure. Processing oven 100 may be used for subjecting any type of samples to any temperature process, such as, for example, solder reflow process. In the discussion below, processing oven 100 will be described in terms of its preferred use as a solder reflow oven. However, this use is exemplary and illustrative only, and is not a requirement. Oven 100 may be used for any other appropriate application.

Oven 100 includes a process chamber 40, configured to receive one or more substrates (e.g., wafers, organic/ceramic substrates, semiconductor packages, printed circuit board (PCB), etc.), and adapted to subject the one or more substrates to a high temperature process. For the sake of brevity, in the discussion below, a semiconductor wafer with solder on its top surface (see FIG. 2) will be described as the exemplary substate that is subject to an exemplary solder reflow process in oven 100. Reference to a single wafer in the discussion below is only exemplary. In general, any number and type of substrate (as described above) may be processed in oven 100, and any size of the substrate (e.g., 200 mm wafer, 300 mm wafer, etc.) may be received in chamber 40.

Figure 2:
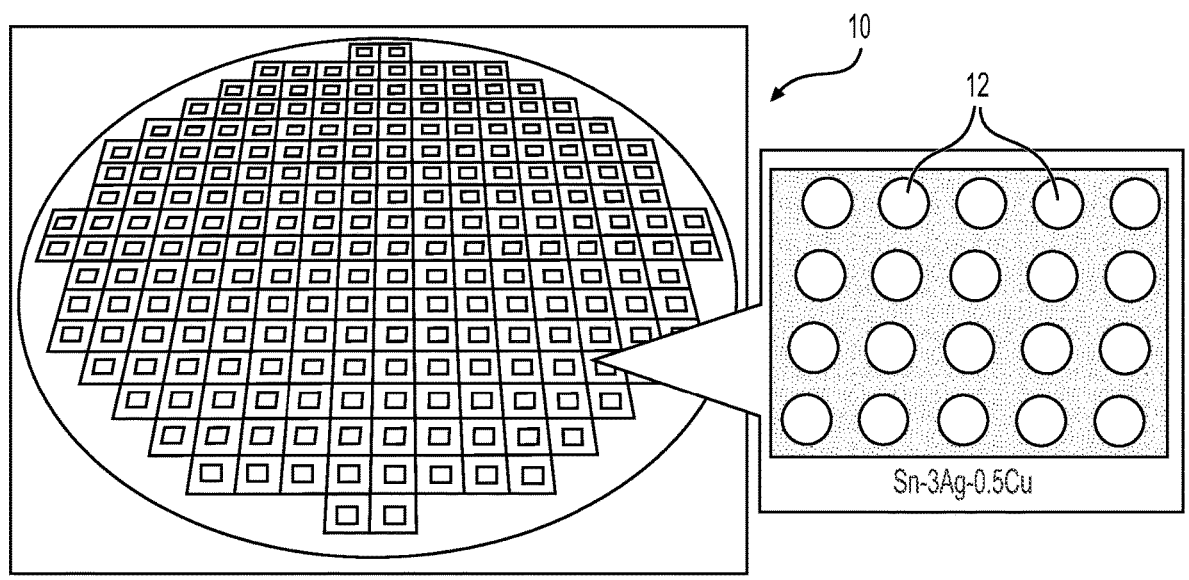
FIG. 2 illustrates an exemplary substrate configured to be processed in the processing oven of FIG. 1A.

FIG. 2 illustrates an exemplary semiconductor wafer 10 that may be received in chamber 40 and subject to a reflow process. As would be recognized by a person skilled in the art, after integrated circuit processing, wafer 10 includes multiple dies (or IC chips), and solder material may be deposited on the I/O pads of the multiple dies in wafer 10. Prior to dicing the wafer 10 into individual dies, wafer 10 may be subject to a reflow process in oven 100 to form solder bumps 12 thereon (called wafer bumping). Any type of solder material (lead-free solder, lead-tin solder, etc.) may be deposited on wafer 10 and the wafer 10 may be subject to any type of reflow process or reflow profile. Persons having ordinary skill in the art would recognize that reflow process that wafer 10 is subjected can depend on the type of solder material deposited on wafer 10. Suitable reflow profiles for different types of solder materials are available in the published literature and may be obtained from solder vendors.

Figure 3:
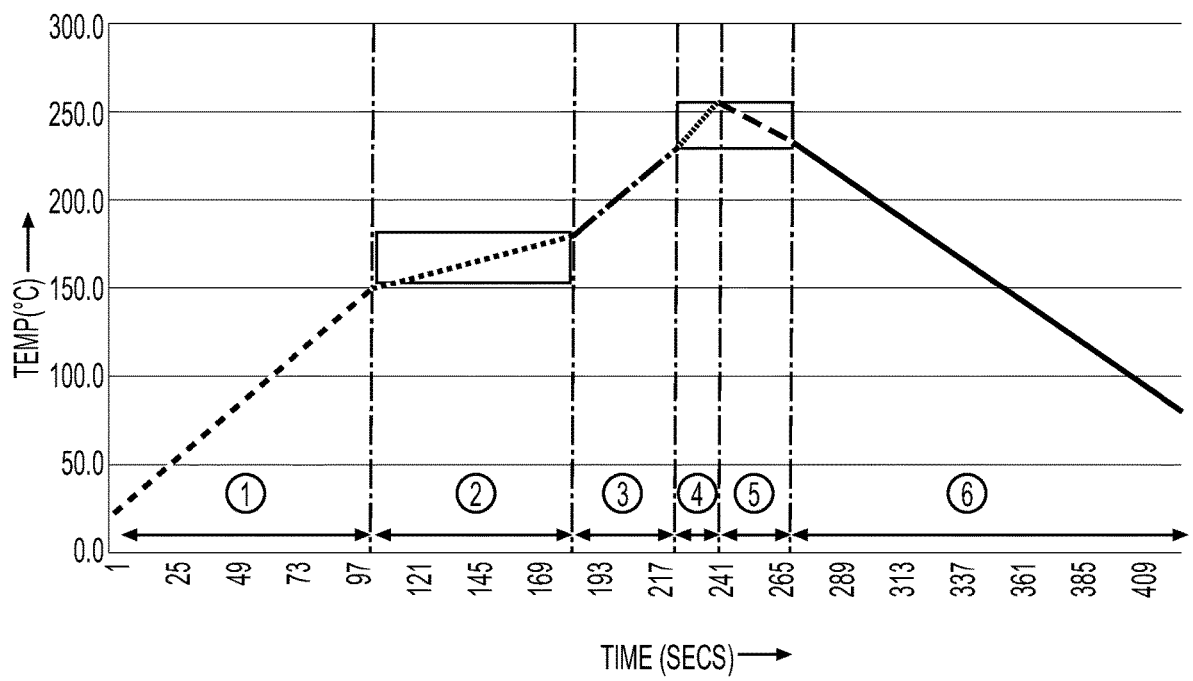
FIG. 3 illustrates an exemplary temperature profile that can be used to process the substrate of FIG. 2.

FIG. 3 illustrates an exemplary reflow temperature profile that may be applied to wafer 10 in chamber 40. In FIG. 3, the X-axis shows time in seconds, and the Y-axis shows temperature in degrees Celsius (° C.).

Figure 4:
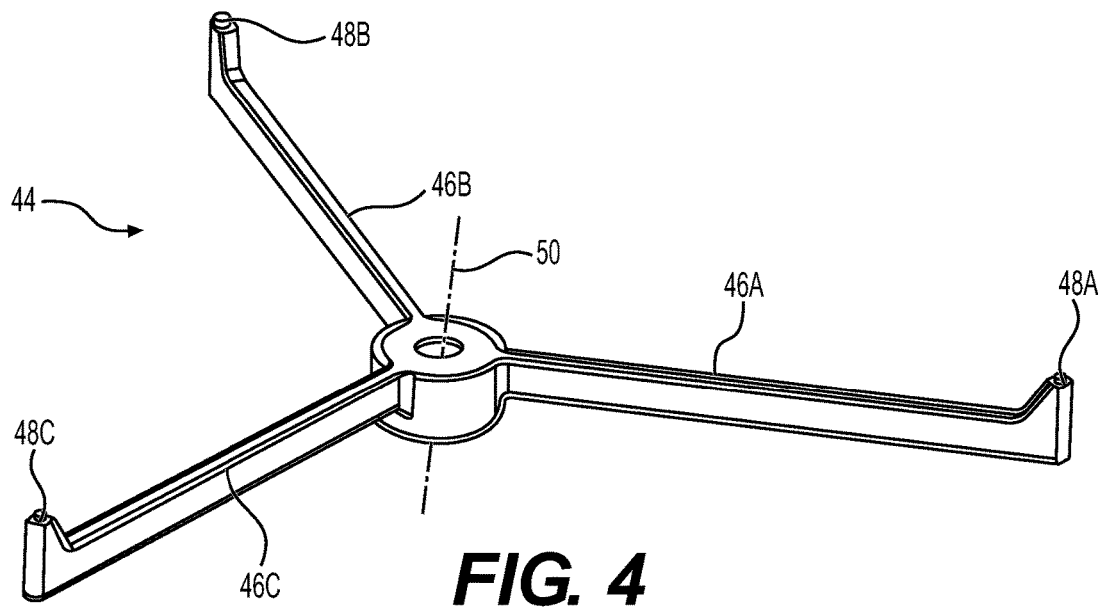
FIG. 4 illustrates a spindle of the processing oven of FIG. 1A.
Figure 5A:
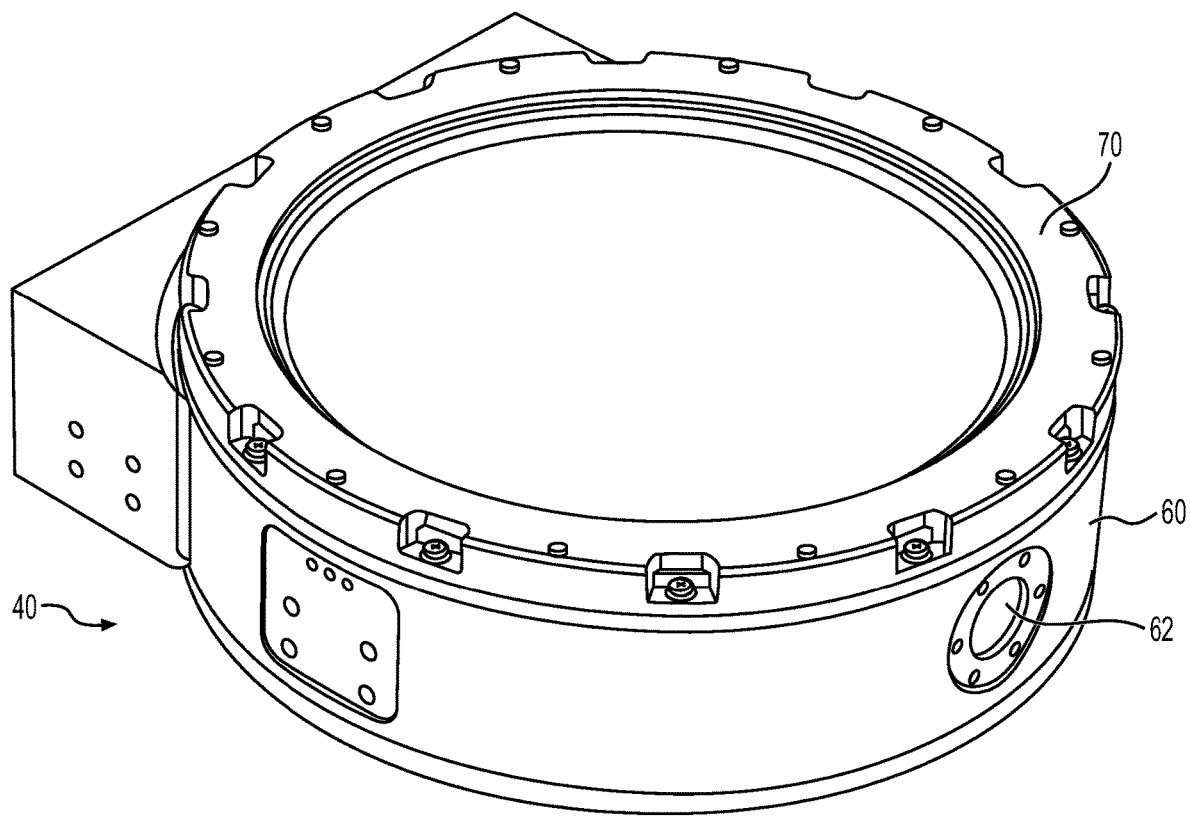
FIGS. 5A and 5B are perspective views of the processing chamber of the processing oven of FIG. 1A.
Figure 5B:
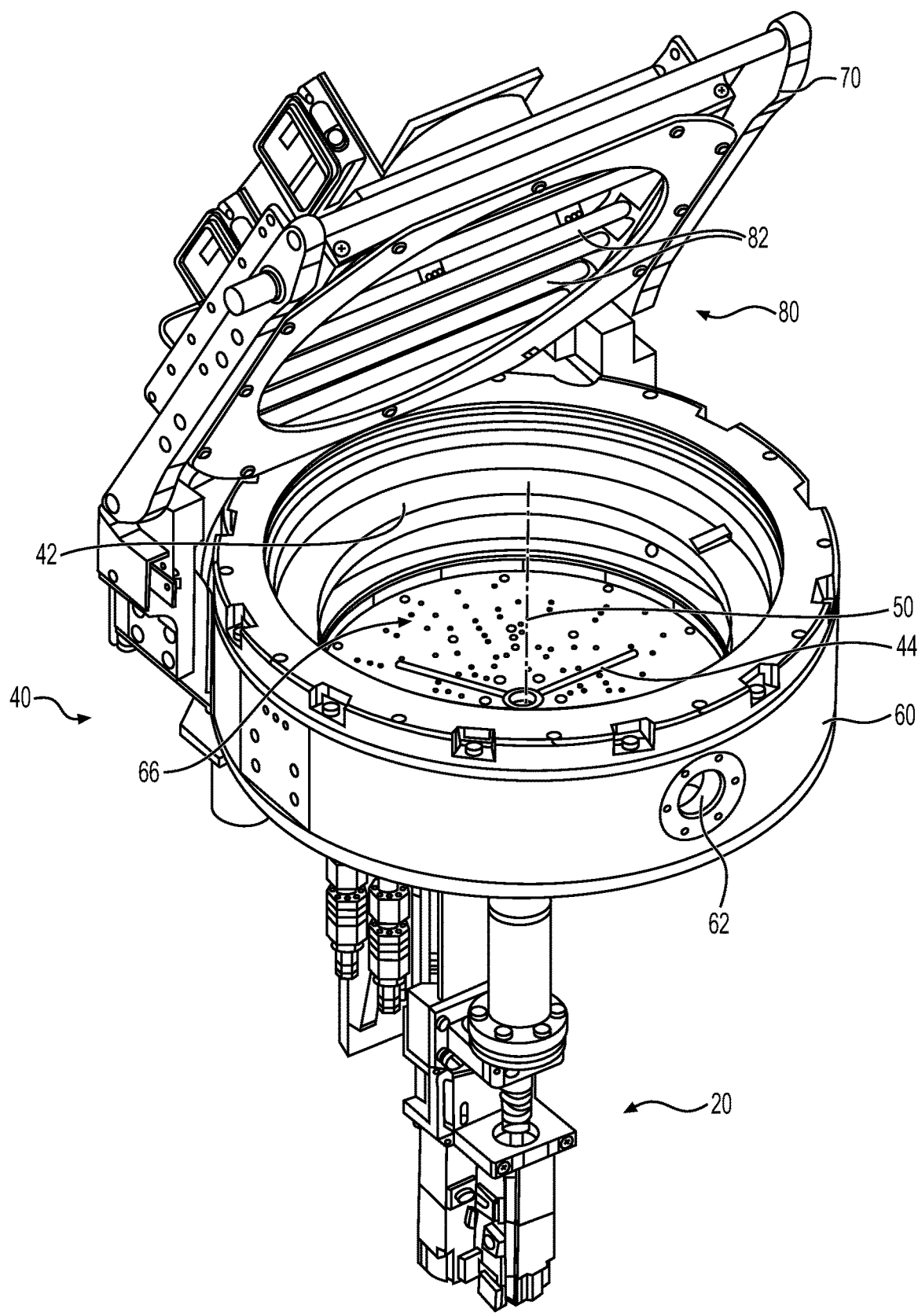

A robotic manipulator or arm (not shown) can insert wafer 10 into chamber 40 through an inlet port 42 (see FIGS. 1B and 5B). Wafer 10 can be disposed on a rotatable spindle 44 within chamber 40. FIG. 4 illustrates an exemplary spindle 44 positioned within chamber 40 (see FIG. 5B). Spindle 44 can include a plurality of arms 46A, 46B, 46C (e.g., 3 arms) that can extend radially outward from a central axis 50. Each arm 46A, 46B, 46C of spindle 44 can include protrusions or nubs 48A, 48B, 48C that projects upwards from the arm. Wafer 10 can rest on the nubs 48A, 48B, 48C of spindle 44. Oven 100 also includes a motor assembly 20, configured to support and control the movement of wafer 10 in chamber 40. Motor assembly 20 can include one or motors configured to rotate spindle 44 (and wafer 10 supported thereon) in the chamber 40 about its central axis 50. Spindle 44 can be rotated at any speed. Although not a requirement, in some embodiments, the rotational speed of spindle 44 can vary between about 0 to 20 RPM. In some embodiments, motor assembly 20 can include multiple motors. For example, motor can raise and lower the rotating wafer along axis 50 (on spindle 44) between multiple vertically spaced-apart regions or zones within chamber 40, and a separate motor can rotate spindle 44. Oven 100 can also include a lamp assembly 80 with a plurality of lamps 82 (see FIGS. 5B, 5C) configured to heat a top surface of wafer 10 in chamber 40.

FIGS. 5A and 5B illustrate an exemplary processing chamber 40 of oven 100. As illustrated in these figures, in some embodiments, chamber 40 can have a substantially cylindrical configuration. A substantially cylindrical shape is not required. In general, processing chamber 40 can have any shape. In some embodiments, the chamber 40 can be substantially square, substantially rectangular, or have another shape. In some embodiments, as illustrated in FIG. 5B, oven 100 can have a hinged lid 70 attached to base 60. However, a hinged lid is not a requirement, and in some embodiments, oven 100 can include separable lid 70. Base 60 and lid 70 define an enclosed space or enclosure 66 (see FIG. 5B) that contains the spindle 44.

The diameter (or width) of the interior or chamber 40 (i.e., enclosure 66) can be such that the wafer 10 can be positioned and rotated (about axis 50) in enclosure 66. The size of chamber 40 and enclosure 66 depends upon the application, for example, the size of the wafer that will be processed in chamber 40. In some embodiments, in an oven 100 and chamber 40 configured to process 300 mm wafers, enclosure 66 can have a diameter of about 450 mm and a height of about 150 mm. The inlet port 42, through which wafer 10 is inserted into enclosure 66 of chamber 40 may be defined on base 60. In some embodiments, a valve or a flap can seal the opening of inlet port 42 into enclosure 66 such that enclosure 66 can be pumped down to a low pressure (or pumped up to a high pressure). Base 60 can include one or more gas ports 62. In some embodiments, process gas can be directed in enclosure 66 through gas port 62. In some embodiments, vacuum pump may be coupled to gas port 62 to generate a vacuum in enclosure 66.

Figure 5C:
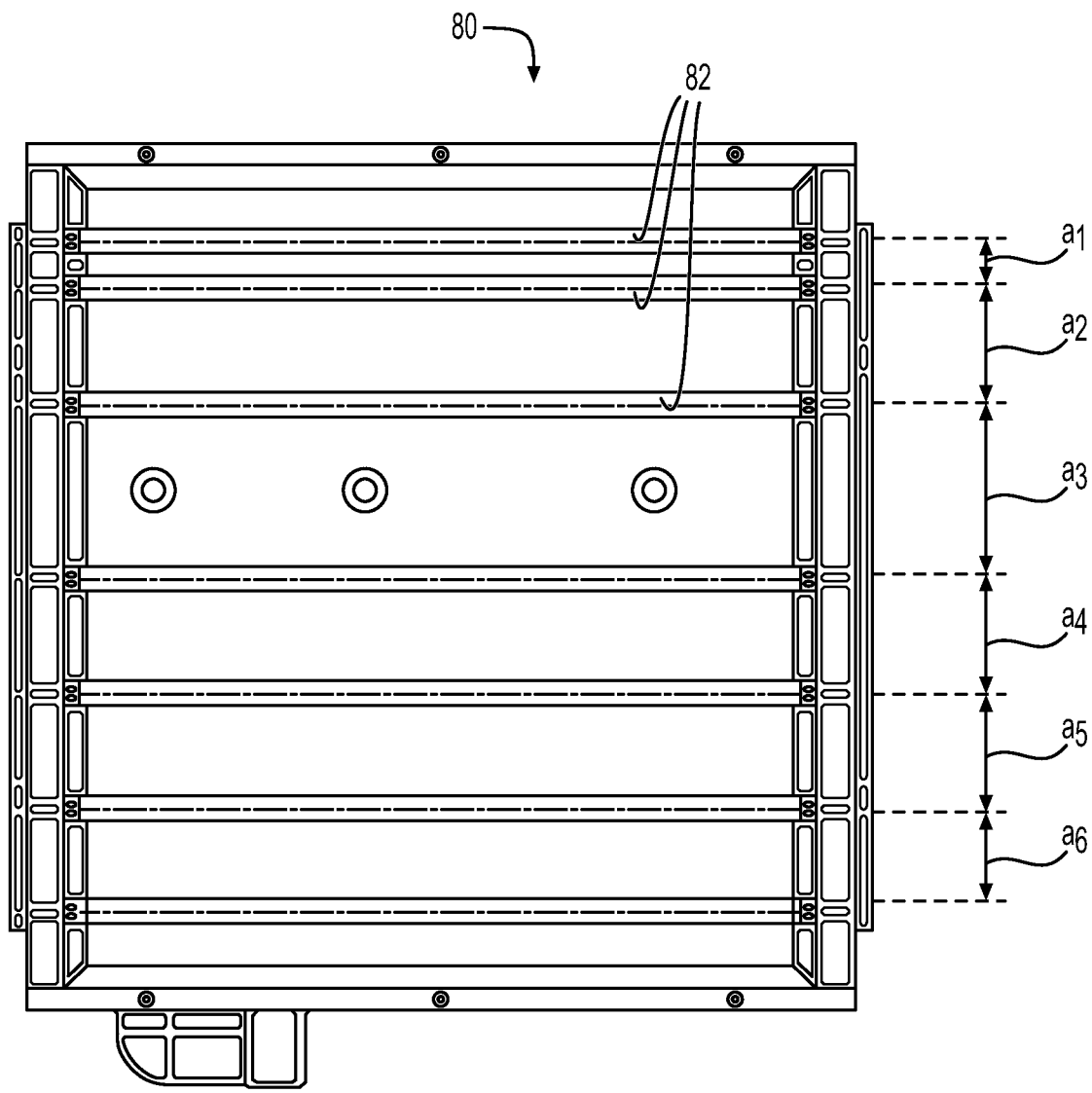
FIG. 5C illustrates an exemplary lamp assembly of the processing oven of FIG. 1A.
Figure 5D:
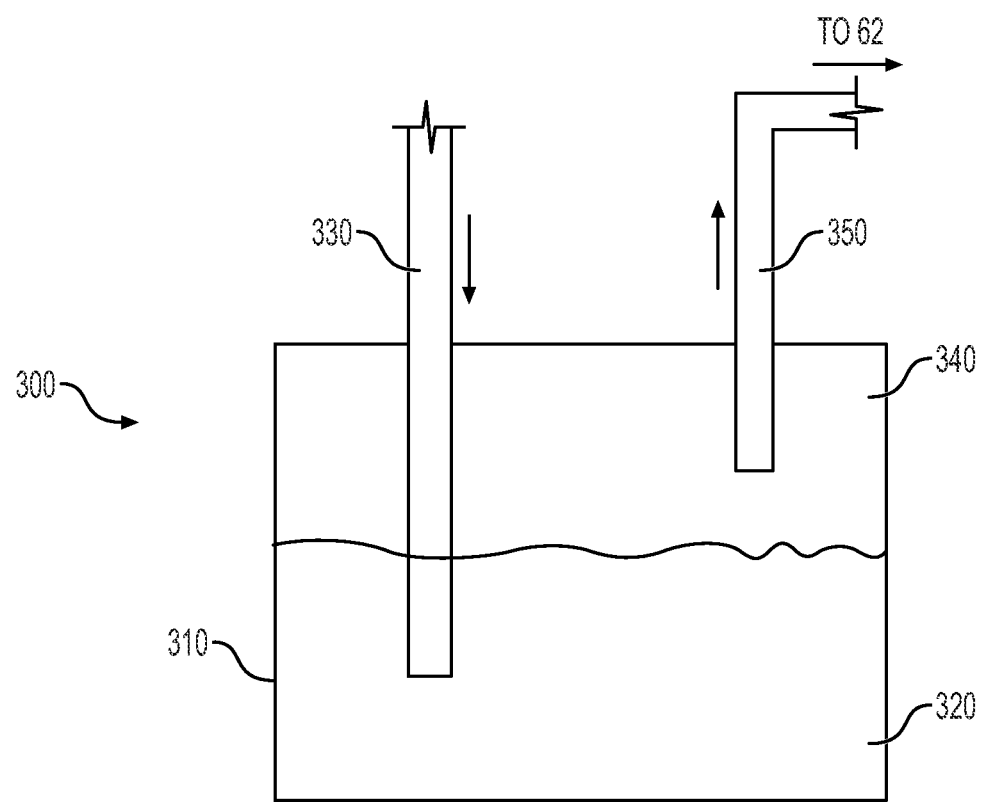
FIG. 5D is an exemplary bubbler device that may be used with the processing oven of the current disclosure.

In some embodiments, as schematically illustrated in FIG. 1A, a bubbler 300 can be fluidly coupled to gas port 62 such that a process gas, such as a chemical vapor, generated by bubbler 300 can be directed into the enclosure 66 through this port. FIG. 5D is a schematic illustration of an exemplary bubbler 300. Bubbler 300 includes an enclosed container 310 containing a liquid chemical 320. A gas (e.g., an inert gas, such as, for example, nitrogen) is directed into the chemical 320 through an inlet tube 330. As illustrated in FIG. 5D, the outlet opening of inlet tube 330 can be submerged in the chemical 320 stored in the bubbler 300 such that the gas exiting the inlet tube 330 passes through (or bubbles through) the chemical 320. As a result of the gas passing through the chemical 320, a vapor containing the chemical 320 and the gas (chemical vapor) may collect in a space 340 above the level of the chemical 320 in the container 310. An outlet tube 350 can be positioned in bubbler 300 such that one end of this tube 350 (the end with its inlet opening) is disposed in the space 340 above the chemical 320. The opposite end (the end with the outlet opening) of the outlet tube 350 can be fluidly connected to the gas port 62 of the processing chamber 40 (see FIG. 5B). The temperature and pressure in the container 310 can be controlled to control (or tune) the concentration of the chemical in the chemical vapor and the partial pressure of the chemical vapor.

In some embodiments, formic acid liquid can be stored as the chemical 320 in the bubbler 300, and nitrogen gas may be directed in through the inlet tube 330 to flow through formic acid liquid. As a result, a vapor containing nitrogen gas and formic acid (or formic acid vapor) can be collected in the space 340 above the liquid in container 310. This vapor mixture can be directed into enclosure 66 of processing chamber 40 through outlet tube 350 and gas port 42. The concentration of formic acid in the formic acid vapor exiting the bubbler 300 can be varied by controlling the temperature and pressure of the bubbler 300 (e.g., of the liquid formic acid in container 310 of bubbler 300). Alternatively, or additionally, in some embodiments, the concentration of formic acid in the vapor can be varied (or tuned) by controlling the temperature and pressure of the nitrogen gas directed into the bubbler 300.

Figure 5E:
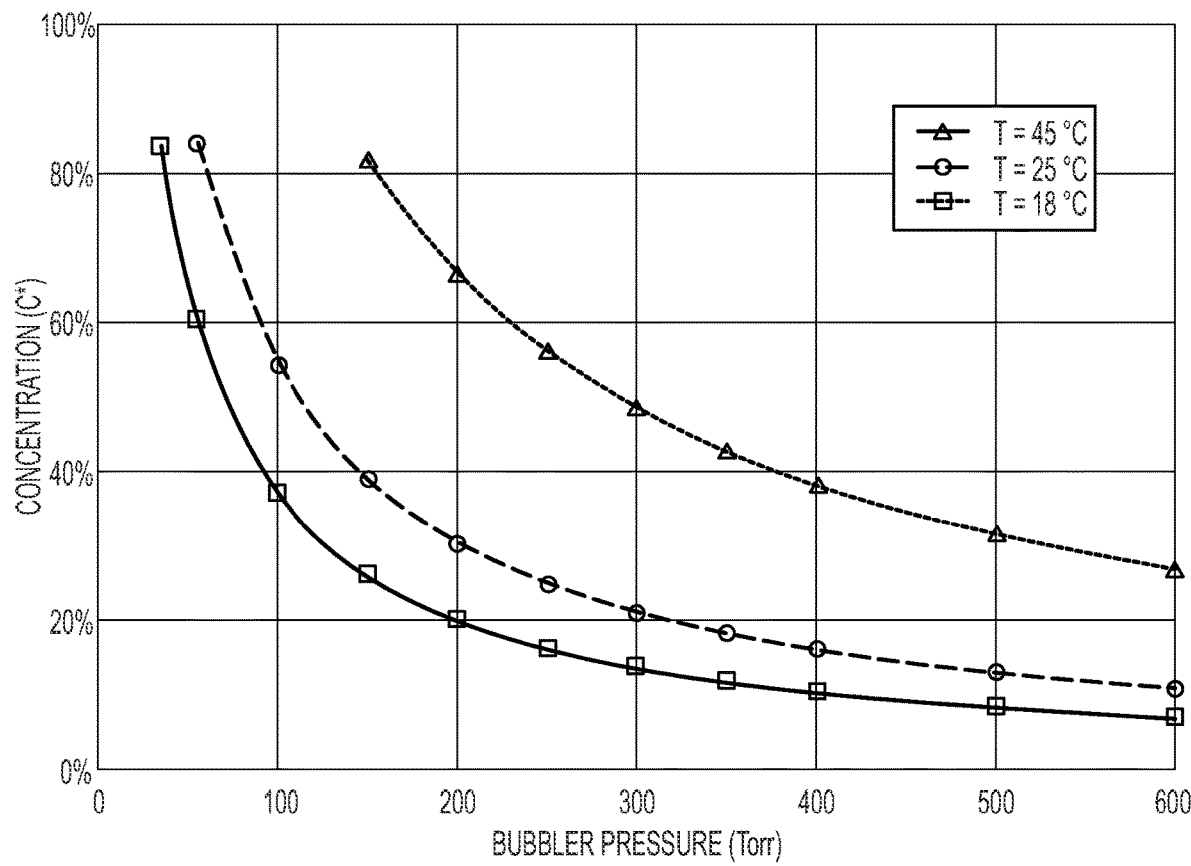
FIG. 5E are exemplary curves showing the relationship between concentration of formic acid vapor at different bubbler pressures and temperatures.

FIG. 5E is an exemplary graph 500 that shows the concentration of the formic acid in the vapor at different bubbler temperatures and pressures. With reference to this graph, when the bubbler pressure is about 200 Torr and the bubbler temperature is about 45° C., the concentration of formic acid in the formic acid vapor directed to the processing chamber 40 will be about 50%. And when the bubbler temperature is decreased to about 25° C., the concentration of formic acid in the vapor decreases to about 20%. The concentration of the formic acid in the formic acid vapor directed to the processing chamber 40 of oven 100 may be controlled in this manner by varying the bubbler temperature and/or bubbler pressure. The graph illustrated in FIG. 5E is only exemplary.

With reference to FIG. 5B, in some embodiments, lamps 82 of lamp assembly 80 can be disposed on an underside of lid 70 such that, when activated, the lamps 72 heat a top surface of wafer 10 positioned in enclosure 66. FIG. 5C illustrates an exemplary lamp assembly 80 on lid 70. In general, lamp assembly 80 can include any number and any type of lamps 82. In some embodiments, lamp assembly 80 can include 4-10 infrared (IR) lamps 82 having a power between about 1-10 kW for each lamp, or between about 1.5-3 kW (or about 2 kW) for each lamp 82. In some embodiments, as illustrated in FIG. 5C, lamp assembly 80 can include seven halogen lamps 82. Lamps 82 can be arranged (e.g., spaced apart) such that they evenly heat the top surface of the wafer 10 in chamber 40. In some embodiments, as illustrated in FIG. 5C, the lamps 82 can be arranged closer together at the edges (of lamp assembly 80) than at the center. As a result of edge effects, the wafer 10 in the chamber 40 may cool down quicker at the edges than at the center. A smaller relative spacing of the lamps 82 at the edges than at the center can assist in achieving an even temperature distribution on the wafer 10.

The spacing between the lamps 82 of lamp assembly 80 can depend on the application (e.g., size of the wafer and the oven 100). With reference to FIG. 5C, in some embodiments (e.g., in an oven 100 configured to process 300 mm wafers), the spacing between the lamps 82 can be such that $a_1$ is between about 10-30 mm (e.g., about 20 mm), $a_2$ can be between about 40-60 mm (e.g., about 50 mm), $a_3$ can be between about 60-80 mm (e.g., about 75 mm), $a_4$ can be between about 40-60 mm (e.g., about 50 mm), $a_5$ can be between about 40-60 mm (e.g., about 50 mm), and $a_6$ can be between about 40-50 mm (e.g., about 45 mm). The above-described spacing values are only exemplary. In general, the spacing between adjacent lamps 82 at the sides of the lamp assembly 80 can be smaller than that at the center of the lamp assembly 80. In some embodiments, the spacing between adjacent lamps 82 at the sides of the lamp assembly 80 (e.g., $a_1$ or $a_2$ or $a_5$ or $a_6$) can be between about 10-60 mm, and the spacing between adjacent lamps 82 at the center of the lamp assembly 80 (e.g., $a_3$ or $a_4$) can be greater than that at the sides and between about 40-80 mm.

In some embodiments, lamps 82 can be controlled by control system 200 (schematically illustrated in FIG. 1A) of oven 100 to heat the wafer 10 at a selected temperature ramp rate. For example, a different number of lamps 82 can be activated to increase or decrease the ramp rate. Alternatively, or additionally, in some embodiments, the power of lamps 82 can be varied to vary the temperature ramp rate in enclosure 66. In some embodiments, the control system 200 can control the power to the lamps 82 based on the detected temperature in the chamber 40 (e.g., using a feedback loop). For example, when thermocouples (or pyrometers or another temperature detection sensor) in chamber 40 indicate that the temperature of the wafer is below a desired value, the control system 200 can increase the power to the lamps 82. In some embodiments, when the thermocouples indicate that the temperature variation in the wafer is above a threshold value (e.g., temperature at the edges of the wafer is below the temperature at the center, etc.), the control system 200 can vary the power to different lamps 82 in the lamp assembly 80. Although not visible in FIG. 5B, in some embodiments, a window made of a material that is transparent to the wavelength of light emanating from lamps 82 may be provided between base 60 and lid 70 to seal the top of enclosure 66 from the external environment. In such embodiments, the lamps 82 heat the wafer 10 in enclosure 66 through the transparent window. In some embodiments, the window can be made of, for example, quartz, glass, etc.

Figure 6A:
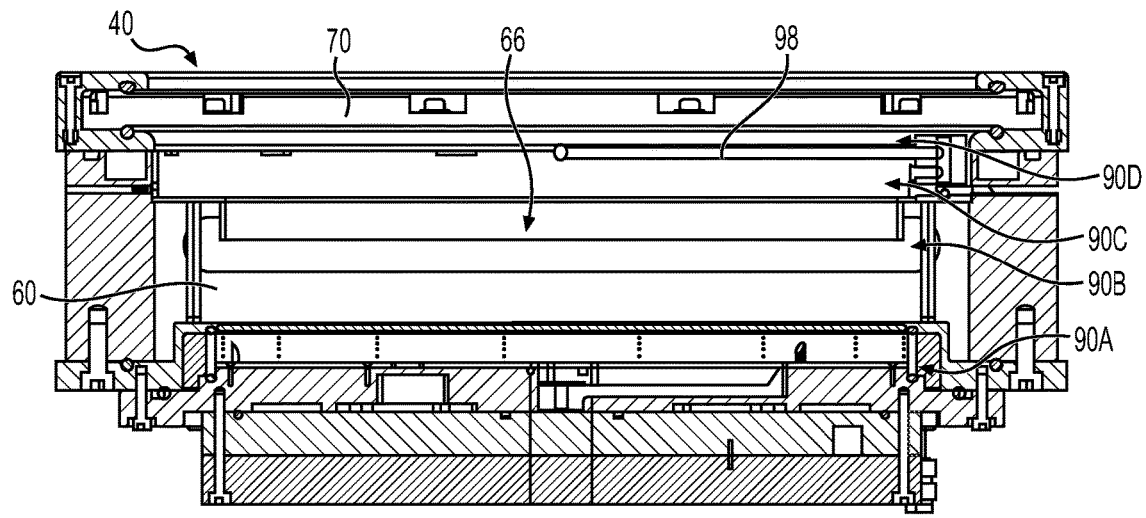
FIGS. 6A and 6B are cross-sectional views of portions of the processing chamber of FIG. 5A along a vertical plane.

FIG. 6A illustrates a side view of chamber 40. Enclosure 66 of chamber 40 can define a plurality of vertically spaced-apart virtual zones. These can may include cool-down zone 90A at the base of enclosure 66, transfer zone 90B directly above cool-down zone 90A, dosing zone 90C directly above transfer zone 90B, and fast ramp zone 90D directly above the dosing zone 90C and at the top of enclosure 66. These virtual zones 90A-90D of enclosure 66 can be adapted for different functions during reflow processing of wafer 10. During processing, spindle 44 is configured to move (i.e., raise and lower) wafer 10 positioned on nubs 48A-48D (see FIG. 4) between one or more of zones 90A-90D of enclosure 66.

Figure 6B:
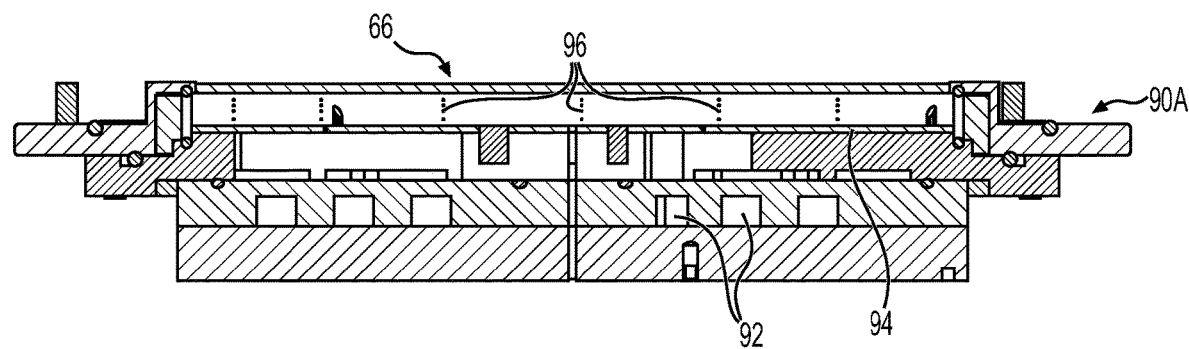

FIG. 6B is a side view of cool-down zone 90A of enclosure 66. Cold plate 94 forms the base of enclosure 66. In some embodiments, while in cool-down zone 64A, wafer 10 can physically contact, or may be positioned near, cold plate 94 to be cooled by conduction. Cold plate 94 includes coolant channels 94 configured to direct a coolant (water or another liquid coolant) therethrough to remove heat conducted from wafer 10. Cold plate 94 also includes plurality of openings 95 (see FIG. 7A) that can be configured to direct an inert gas (e.g., nitrogen) into enclosure 66. In some embodiments, nitrogen can be directed into enclosure 66 via openings 95 to cool underside of wafer 10 by forced convection. A plurality of gas-inlet ports 96 can be positioned in cool-down zone 90A to direct inert gas (e.g., nitrogen) into enclosure 66. When wafer is positioned in cool-down zone 90A (e.g., seated on or positioned proximate cold plate 94), inert gas (e.g., nitrogen or other suitable inert gas) can be directed into enclosure 66 to flow above wafer 10 and cool top surface of wafer 10 by convention. In some embodiments, gas ports 96 can be disposed on side wall of base 60 (of chamber 40) and positioned such that inert gas (e.g., nitrogen gas) from these ports flow over the top surface of wafer 10 seated on, or proximate, cold plate 94. In some embodiments, by combining convective and conductive heat transfer, wafer 10 can be cooled at a rate greater than or equal to ($\geq$) about 60° C./minute. Although not required, in some embodiments, the region from base of enclosure 66 (i.e., top surface of cold plate 94) to a height of about 60 mm from base can form the cool-down zone 90A of enclosure 66. That is, in some embodiments, cool-down zone 90A can be a region of enclosure spanning about 0-60 mm from the base of enclosure 66.

Transfer zone 90B is a region above the cool-down zone 90A. The transfer zone 90B can be aligned with port 42 (see FIGS. 1B and 5B) of chamber 40. As explained previously, wafer 10 is inserted into enclosure 66 via port 42. When wafer 10 is inserted into enclosure 66, it enters enclosure 66 at transfer zone 90B. When wafer 10 is inserted, spindle 44 is positioned in transfer zone 90B such that the inserted wafer 10 can be supported on nubs 48A, 48B, 48C of spindle 44. Although not required, in some embodiments, transfer zone 90B can be a region of enclosure spanning about 60-90 mm from the base of enclosure 66.

Dosing zone 90C is a region of the enclosure 66 above the transfer zone 90B. When wafer 10 is positioned in the dosing zone 90C, formic acid vapor (or another chemical vapor) from bubbler 300 is directed into the enclosure 66 of processing chamber 40 via outlet tube 350 (see FIG. 5D) and gas port 42 (see FIG. 5B). This formic acid vapor can be directed to a chemical delivery tube 98 positioned proximate the top of enclosure 66. The formic acid vapor from the chemical delivery tube 98 can be directed to the dozing zone 90C of enclosure 66. The formic acid vapor can be injected into enclosure 66 by nozzles on the chemical delivery tube 98 while the spindle 44 is rotating. The chemical vapor covers the top surface of wafer 10 and treats all regions of the wafer 10 substantially uniformly. In some embodiments, an edge ring directs chemical vapor to the top of the wafer. Although not required, in some embodiments, dosing zone 90C can be a region of enclosure that spans about 90-120 mm from the base of enclosure 66.

The fast ramp zone 90D is a region of enclosure 66 above the dosing zone 90C. When spindle 44 raises wafer 10 to fast ramp zone 90D, lamps 82 on the underside of lid 70 heat wafer 10. In some embodiments, lamps 82 can heat wafer 10 at a rate ≥about 120° C./minute. Rotation of spindle 44 can ensure that all regions of the wafer 10 are heated substantially uniformly. One or more thermocouples and/or pyrometers can measure temperature of wafer 10 during heating. In some embodiments, control system 200 can control power of lamps 82 using a feedback loop (e.g., PID control) to control the wafer temperature. In some embodiments, one or more thermocouples can be provided in spindle 44 to measure the temperature of the wafer 10 during heating. In some such embodiments, a spring may keep thermocouple (s) in contact with wafer 10. In some embodiments, one or more pyrometers focused on the rotating wafer 10 can be disposed at top or bottom of the enclosure 66 to measure the temperature of wafer 10 during heating.

Figure 7A:
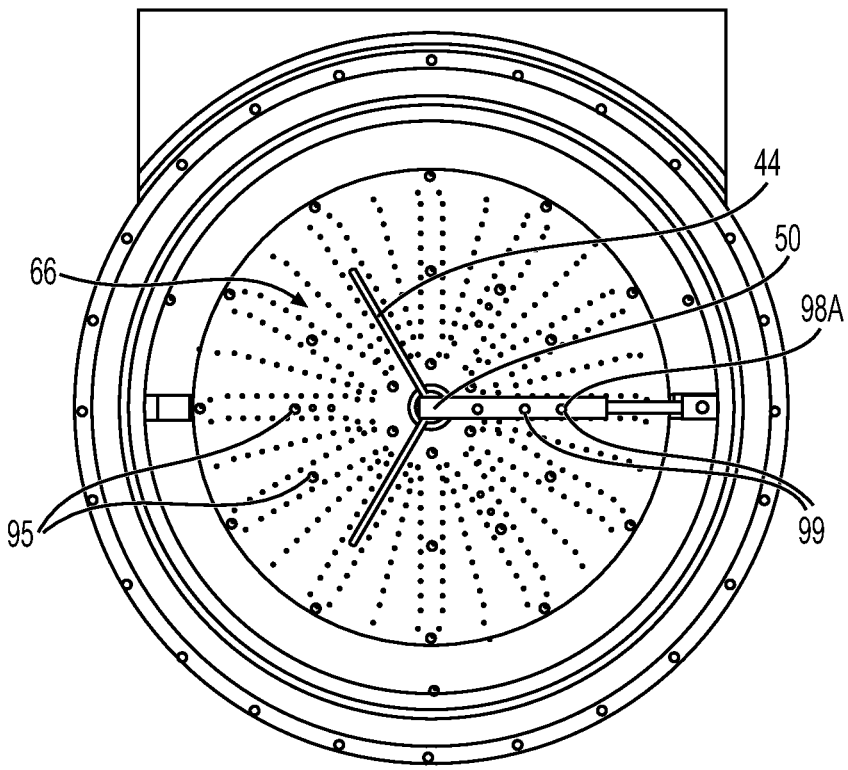
FIGS. 7A-7C are top views of the processing chamber of FIG. 5A in different exemplary embodiments.
Figure 7B:
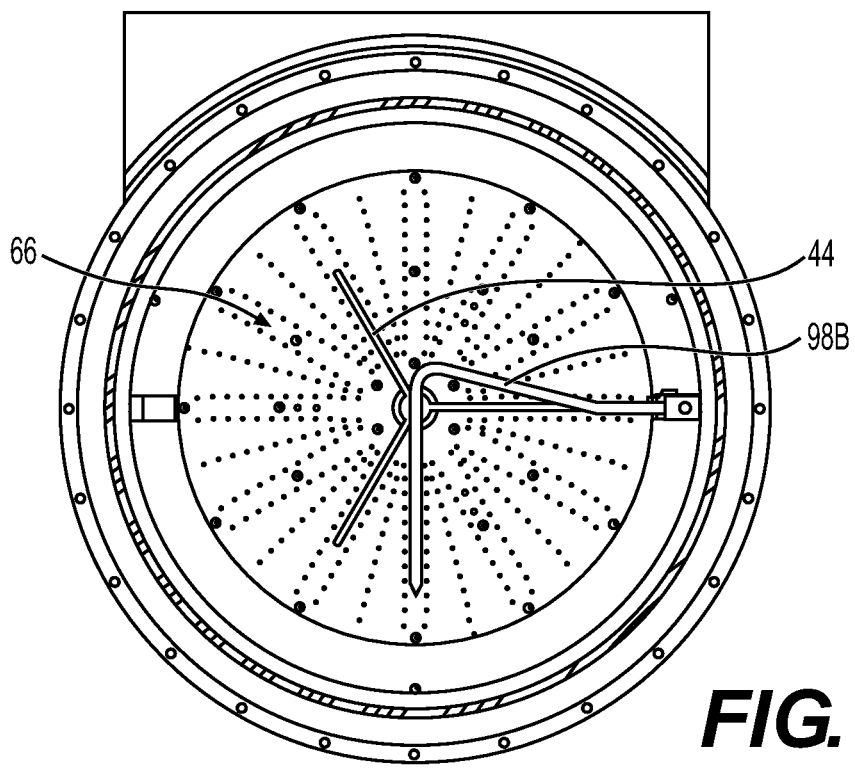
Figure 7C:
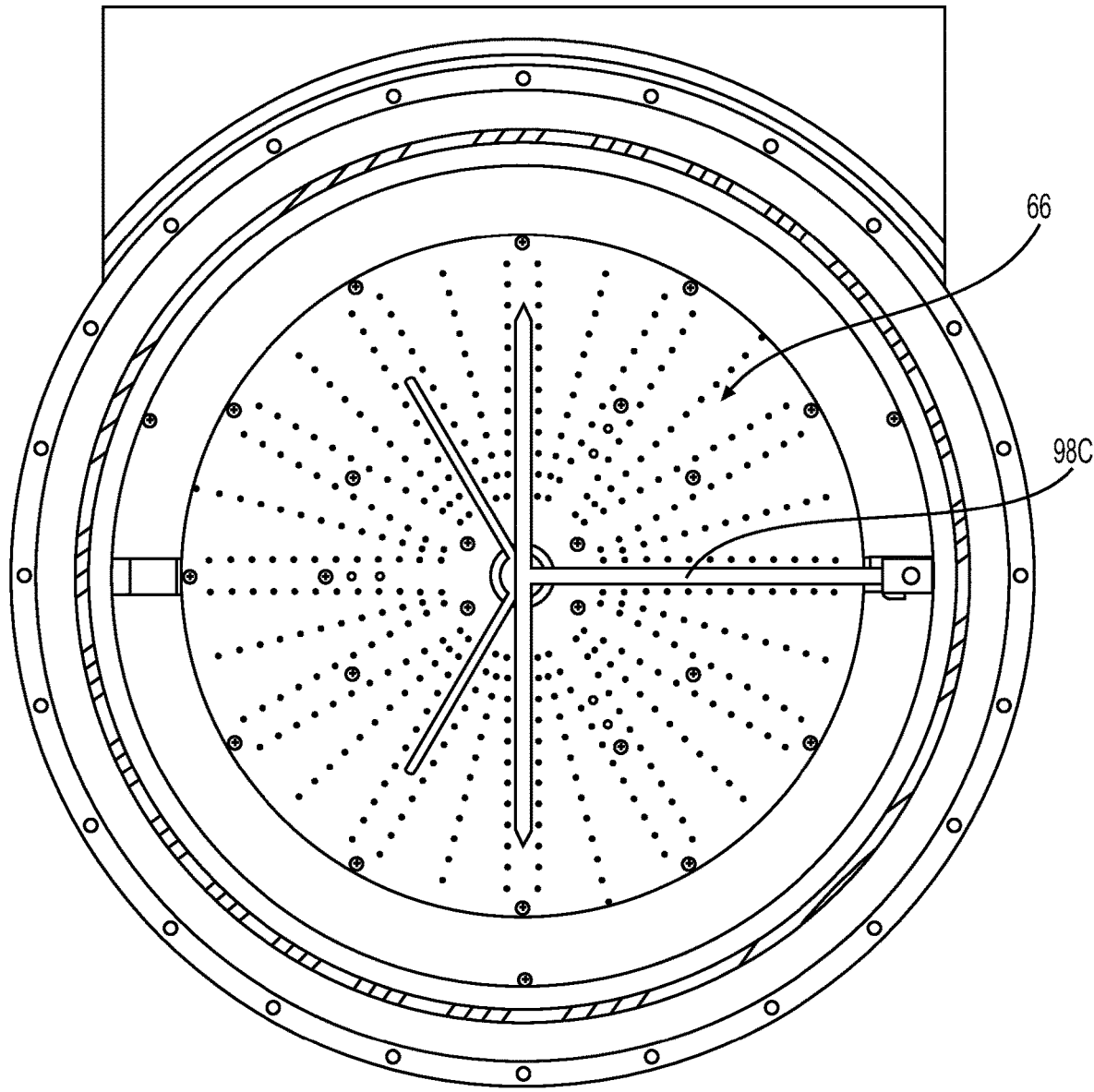

As explained previously, when wafer 10 is positioned in dosing zone 90C, formic acid vapor from the bubbler 300 is injected into enclosure 66 via chemical delivery tube 98 positioned at the top of enclosure 66. Chemical delivery tube 98 can have a shape configured to discharge chemical vapor substantially uniformly over the wafer 10. FIGS. 7A-7C illustrate different configurations of chemical delivery tubes 98A-98C that can be used in different embodiments of oven 100. In some embodiments, as illustrated in FIG. 7A, chemical delivery tube 98A can be straight tube that extends from one side of chamber 40 to the center of wafer 10. Multiple nozzles 99 or ports can be positioned on underside of tube 98A facing wafer 10. Any number (2-20) of nozzles 99 can be provided on tube 98A. Dispersing gas into enclosure 66 at different radial locations of the rotating wafer 10 can assist in treating solder bumps in all areas of wafer 10 substantially uniformly. In some embodiments, as illustrated in FIG. 7B, an angled (or bent) chemical delivery tube 98B can be used. In some embodiments, as illustrated in FIG. 7C, a T-shaped chemical delivery tube 98C can be used. Although not shown in FIGS. 7B and 7C, spaced apart nozzles 99 can be provided on underside of tubes 98B, 98C facing wafer 10 to uniformly treat all regions of the rotating wafer 10. In some embodiments, based on the type, size, and/or shape of the wafer 10 being processed, a different configuration of chemical delivery tube 98A, 98B, 98C can be used.

In some embodiments, when formic acid vapor is directed into the enclosure 66 via chemical delivery tube 98 on the top side of wafer 10, inert gas (e.g., nitrogen) can be directed into the enclosure 66 on the bottom side of wafer 10. Inert gas can be introduced into enclosure through openings 95 on cold plate 94 and/or through gas ports 96. Simultaneously directing the inert gas under wafer 10 when formic acid vapor is directed above wafer 10 allows the formic acid vapor to cover and treat all regions on the top surface of wafer substantially evenly.

An exemplary method 200 of processing a wafer 10 in oven 100 using the exemplary reflow profile of FIG. 3 will now be described. As illustrated in FIG. 3, reflow profile of FIG. 3 is preferably defined by six time-temperature process zones (zones 1-6). A wafer 10 is first loaded into enclosure 66 of chamber 40 through port 42 (step 210). Wafer 10 can be inserted into enclosure 66 via port 42 and disposed on spindle 44 positioned in transfer zone 90B, for example, using robotic arm. Spindle 44 can rotate wafer (step 220) and raise wafer 10 to fast ramp zone 90D of enclosure 66 (step 230). In some embodiments, pressure in enclosure 66 can also be evacuated to a pressure below atmospheric pressure. In some embodiments, enclosure 66 can be pumped down to a pressure between about 100 milliTorr-100 Torr. In some embodiments, the enclosure can be pumped down to a pressure between about 1-10 Torr. Control system 200 activates lamps 82 of lamp assembly 80 to heat wafer 10 and increase its temperature (step 240). In some embodiments, lamps 82 may be turned on before wafer 10 is loaded on spindle 44 in step 210. While in fast ramp zone 90D (i.e., step 230), temperature of wafer 10 can increase as illustrated in zone 1 of FIG. 3.

When thermocouples and/or pyrometers of enclosure 66 indicate that temperature of wafer 10 has reached a target temperature of process zone 1 (about 150° C. in FIG. 3), control system 200 can lower spindle 44 with wafer 10 to dosing zone 90C (step 250). While in dosing zone 90C, chemical vapor (e.g., formic acid vapor) can be directed into enclosure 66 through chemical delivery tube 98 above wafer 10 while simultaneously directing inert gas (e.g., nitrogen) into enclosure 66 through gas-inlet ports 96 (and/or openings 95 on cold plate 94) below wafer 10 (step 260). Inert gas flow below wafer 10 assists in keeping chemical vapor above wafer 10 such that substantially all regions of rotating wafer 10 are evenly exposed and coated with vapor. During this step, temperature of the wafer 10 can follow the path illustrated in zone 2 of FIG. 3.

After wafer 10 is coated with chemical vapor in step 260, enclosure 66 can be evacuated using a vacuum pump to remove excess vapor in enclosure 66 (step 270). Alternatively, or additionally, in some embodiments, inert gas (e.g., nitrogen) can be directed into enclosure 66 during this step to exhaust residual chemical vapor that has not been deposited on wafer. Spindle 44 can then raise wafer 10 back to fast ramp zone 90D to continue heating wafer 10 at fast rate (step 280). During this step, temperature of the wafer 10 can follow the profile illustrated in zones 3-5 of FIG. 3 and solder reflows.

After solder reflow is completed, lamps 82 are turned off (or reduced to a safe idle power) by control system 200, and wafer 10 is lowered to the cool-down zone 90A to cool substrate (step 290). In cool-down zone 90A, in some embodiments, wafer 10 can physically contact, or be place in close proximity to, cold plate 94 such that bottom surface of wafer 10 is cooled conductively or radiatively through liquid cooled cold plate 94 and convectively from top via inert (e.g., nitrogen) gas from gas-inlet ports 96 flowing over top of wafer 10. In some embodiments, inert gas (e.g., nitrogen) can also be directed in through openings 95 in cold plate 94 to assist in cooling back side of wafer 10. While in cool-down zone 90A, temperature of wafer 10 can follow profile illustrated in zone 6 of FIG. 3. After cooling is complete, spindle 44 can raise wafer 10 to transfer zone 90B and wafer 10 can be removed from enclosure through port 42 (step 300).

Figure 9:
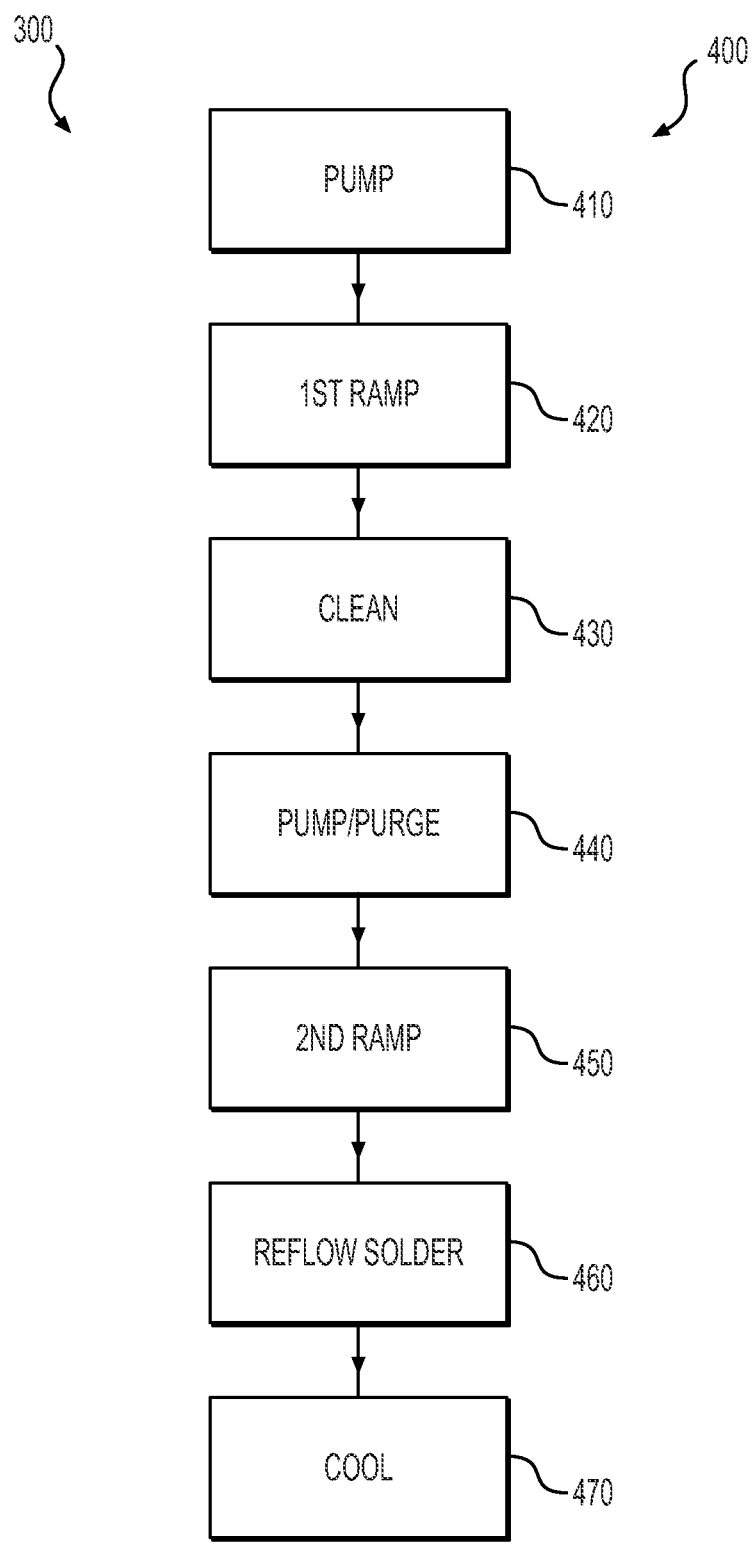
FIG. 9 is a flowchart showing another exemplary method of using the processing oven of FIG. 1A.
Figure 10:
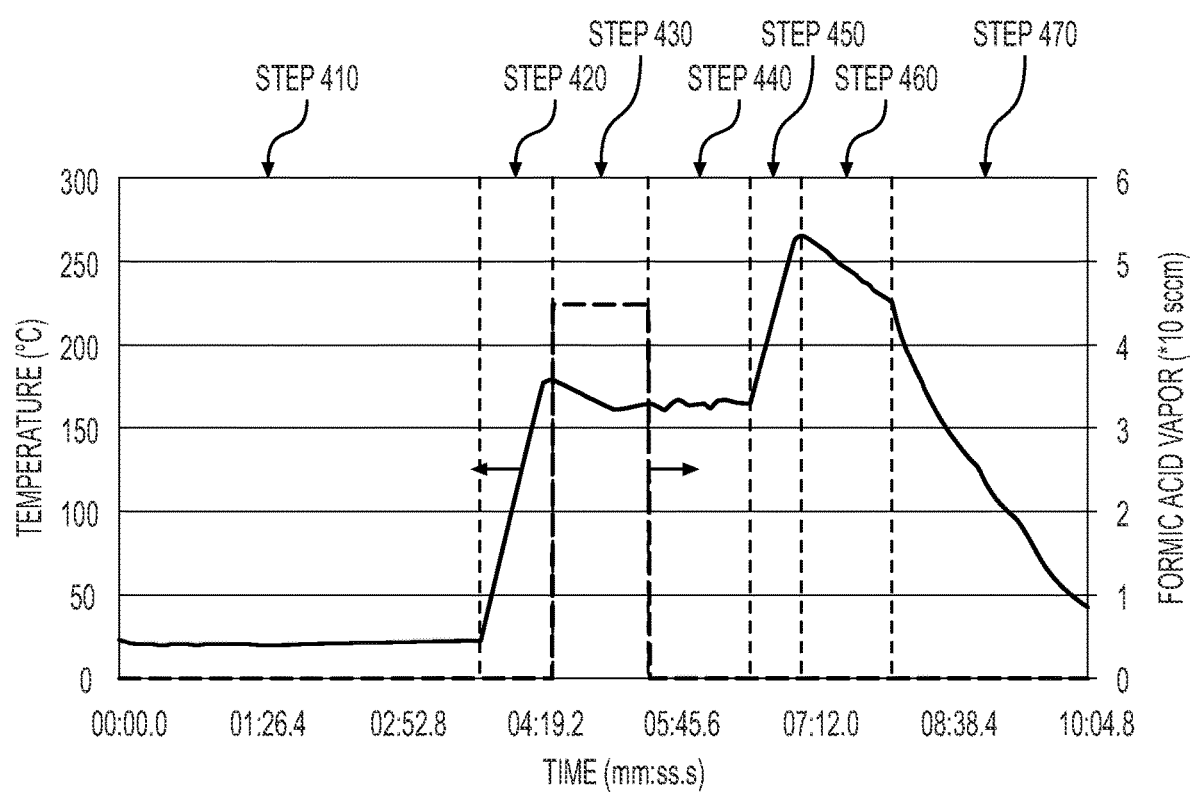
FIG. 10 is an exemplary reflow profile that may be applied in the processing oven of FIG. 1A.
Figure 11:
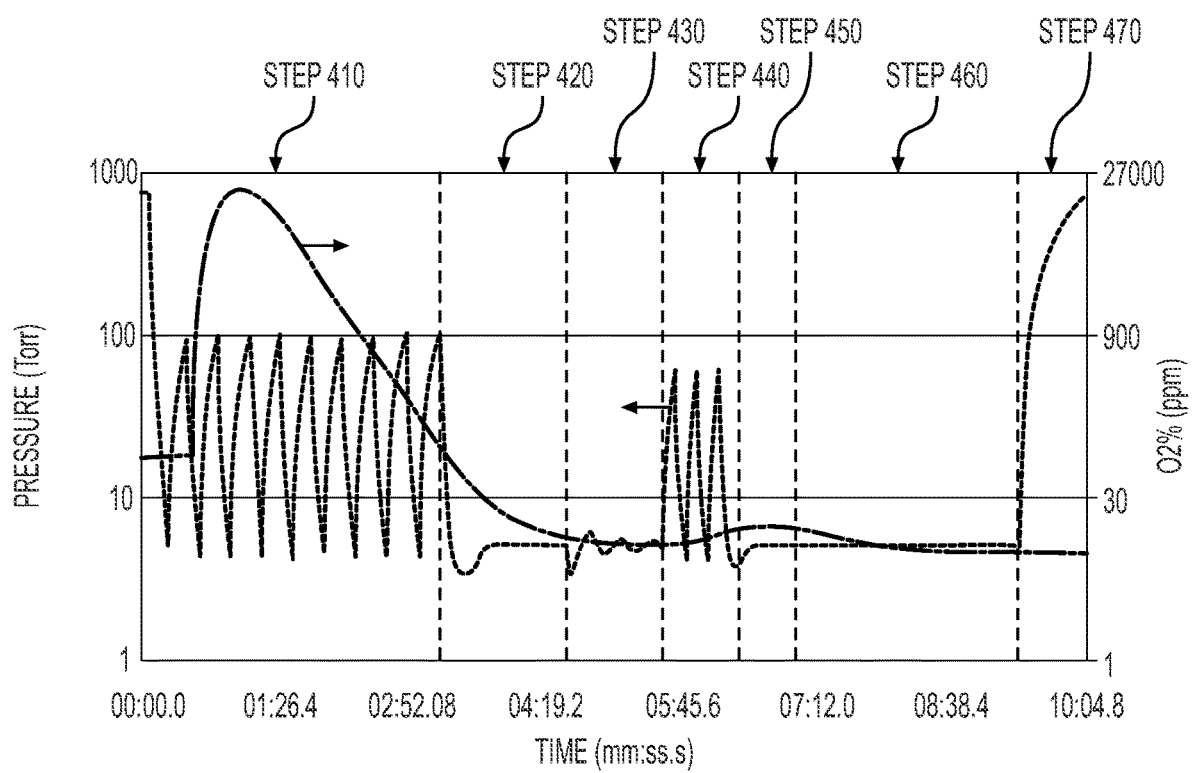
FIG. 11 is a graph showing pressure and oxygen concentration in the processing oven during an exemplary process.

FIG. 9 illustrates another exemplary method 400 of performing high temperature processing (such as, for example, solder reflow) using oven 100. Method 400 will be described with reference to the exemplary reflow profile of FIG. 3. However, method 400 can be applied to any reflow profile or any high temperature processing. FIG. 9 is a flow chart of the process flow of method 400, and FIGS. 10 and 11 illustrate the process conditions in the enclosure 66 (of oven 100) during the different steps of method 400. FIG. 10 is a graph showing the temperature of the enclosure 66 (in degrees centigrade (° C.)), and the flow rate of formic acid vapor (in standard cubic centimeters per minute (SCCM or $cm^3/min$)) into the enclosure 66 during different steps of method 400. In FIG. 10, the X-axis shows the time in seconds, the left Y-axis shows the temperature in ° C., and the right Y-axis shows the formic acid vapor flow rate in $cm^3/min$ during different steps of method 400. In FIG. 11, the X-axis shows the time in seconds, the left Y-axis shows the pressure in enclosure 66 in Torr, and the right Y-axis shows the percentage oxygen concentration (in parts per million (ppm)) in enclosure 66 during the different steps of method 400. In FIGS. 10 and 11, labels corresponding to the different steps of method 400 (of FIG. 9) are included to indicate the evolution of the process conditions in the enclosure 66 during the different steps. In the discussion below, reference will be made to FIGS. 9-11.

Figure 8:
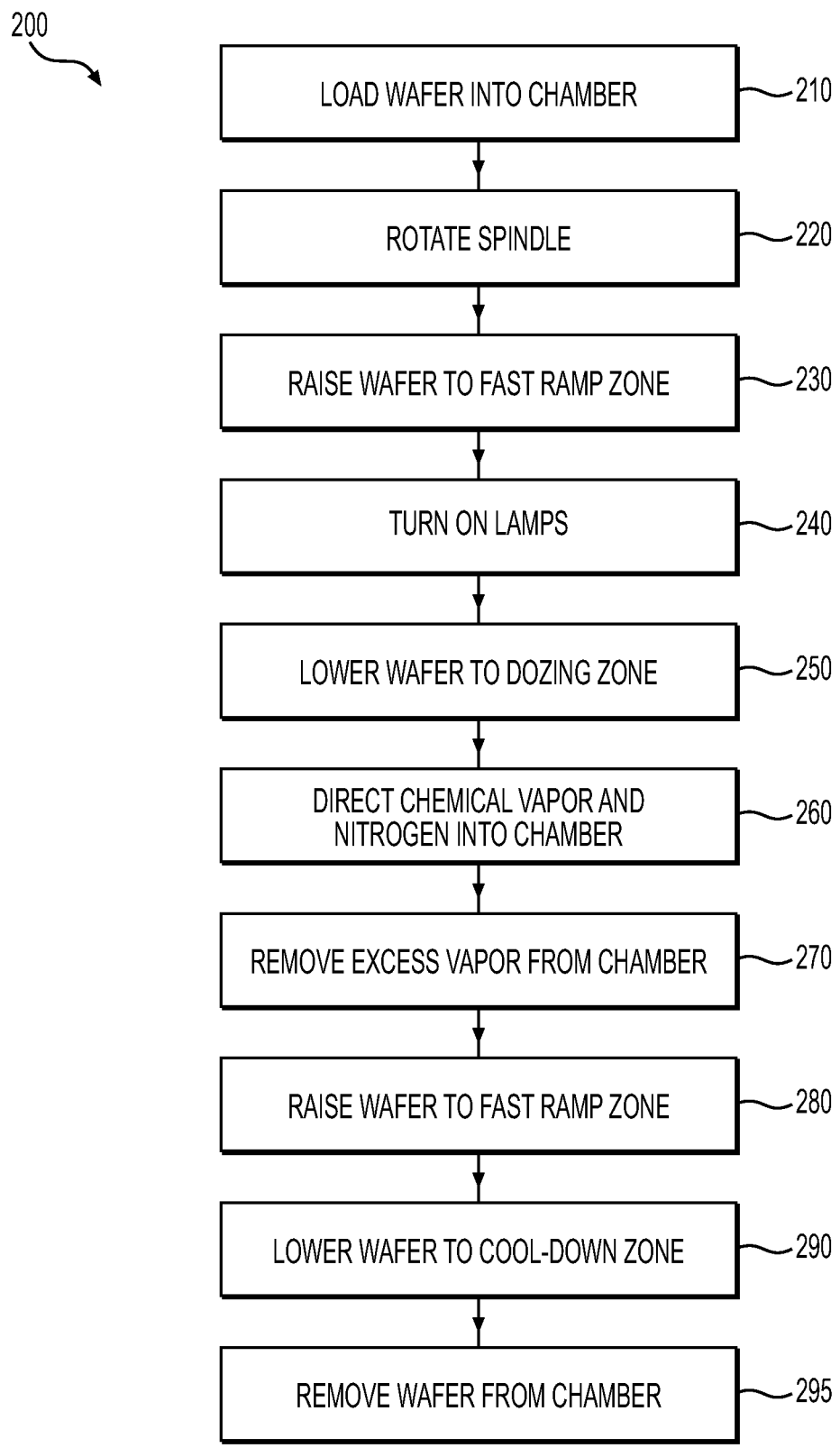
FIG. 8 is a flowchart showing an exemplary method of using the processing oven of FIG. 1A.

As described with reference to method 200 (of FIG. 8), a wafer 10 is first loaded into enclosure 66 of chamber 40 through port 42 and disposed on spindle 44 positioned in transfer zone 90B. The spindle 44 can then be activated to rotate the wafer 10. With reference to FIG. 9, in step 410, the pumping system of oven 100 (e.g., vacuum pump, etc.) then pumps down enclosure 66 to reduce the oxygen concentration in enclosure 66. In some embodiments, as can be seen in FIG. 11, in step 410, the enclosure 66 can be cycled multiple times between about 0.1 Torr and about 50 Torr to reduce the oxygen concentration in enclosure 66. In some embodiments, at the end of step 410, the oxygen concentration may be below about 750 ppm or below about 500 ppm. U.S. Pat. No. 10,147,617, incorporated herein by reference in its entirety as if fully set forth herein, describes an exemplary process by which enclosure 66 can be cycled multiple times between a relatively higher and a relatively lower pressure to achieve a relatively oxygen-free process environment.

In step 420, spindle 44 raises wafer 10 to fast ramp zone 90D of oven 100. While in fast ramp zone 90D, top surface of the wafer 10 is positioned proximate lamps 82 on underside of lid 70. Lamps 82 increase the temperature of wafer 10. Lamps 82 may be activated before or after the wafer 10 is moved to the fast ramp zone 90D. In some embodiments, in step 420, the lamps 420 can heat the wafer to a temperature between about 150° C.-180° C. in step 420. As previously explained, this temperature range is exemplary and the wafer may be heated to any temperature (e.g., based on the reflow profile followed) in this step.

In step 430, the heated wafer 10 is lowered to the dosing zone 90° C. of oven 100. While in this zone, formic acid vapor from bubbler 300 is admitted into chamber through the chemical delivery tube 98 disposed at the top of enclosure 66 (see FIG. 6A). This formic acid vapor is injected into enclosure 66 through the nozzles the chemical delivery tube 98. Using bubbler 300 to produce formic acid vapor is only exemplary. In general, formic acid vapor may be produced by any appropriate source (such as, for example, vaporizer, etc.). Formic acid vapor may cover wafer surface by diffusion and forced convection. An edge ring of oven 100 can direct the chemical vapor to the top surface of the wafer 10. The spindle 44 (or another wafer support mechanism) can rotate the wafer 10 for uniform chemical vapor coating on the surface of the wafer 10. The pressure of the enclosure above the wafer 10 (or the entire enclosure 66) in step 430 may be below about 20 Torr. In some embodiments, the pressure can be below about 10 Torr. In some embodiments, the pressure can be between about 1-8 Torr. [done].

In some embodiments, nitrogen gas (or another inert gas) can also be discharged into the enclosure 66 below the wafer 10 to keep the formic acid vapor on top of the enclosure 66 to coat the top surface of the wafer 10 completely. Nitrogen can be discharged below the wafer 10 through the openings 95 (see FIG. 7A) on cold plate 94 and/or through gas ports 96 on the side wall of the enclosure 66. In some embodiments, the temperature in this zone (dosing zone 90C) can be controlled to be between 150° C.-180° C. (or any other temperature, for example, based on the reflow profile). Due to oxidation, the surface of the solder on wafer 10 may have oxides formed thereon. The formic acid vapor discharged into enclosure 66 through chemical delivery tube 98 can have a controlled concentration of formic acid configured for effective cleaning of these oxides.

After wafer 10 is coated with formic acid vapor in step 430, the formic acid vapor flow into enclosure 66 is stopped. In step 440, at least a portion of the excess formic acid vapor is removed or pumped out from enclosure 66 using the vacuum pump of oven 100. A pump and purge process can be used to remove the excess formic acid vapor from enclosure 66. In this step, the enclosure 66 is cyclically pumped down to a low pressure and purged with nitrogen to remove excess formic acid vapor from enclosure 66. The wafer 10 remains in the dosing zone 90C and the temperature of the wafer 10 is maintained between about 150° C.-180° C. during this step. In some embodiments, the concentration of formic acid vapor in the enclosure after the vapor removal process of step 430 can be below about 50%-80%. In some embodiments, the pressure in enclosure after the vapor removal process of step 430 can be between about 1-10 Torr. In some embodiments, in this step, the nitrogen flow rate into the chamber below the wafer can vary from about 100 sccm to about 5000 sccm to remove the excess formic acid from enclosure 66.

In step 450, the lamps 82 are controlled to increase the temperature of the wafer 10 (or the enclosure 66) to a temperature between about 220° C.-250° C. for the soldering process. As previously explained, the lamps 82 can be controlled by control system 200 (FIG. 1A) to change the temperature of the wafer 10. For example, the control system 200 can turn on/off a different number of lamps 82 and/or increase/decrease power to the lamps 82 to change the temperature of the enclosure 66. In step 460, the wafer 10 is maintained at a temperature between about 220° C.-250° C. for the soldering process. As previously explained, in general, the wafer can be heated to any temperature in this step. In some embodiments, the temperature that the wafer is heated to in step 450 can be higher than the temperature in step 420. In some embodiments, the wafer 10 may be soaked or maintained at the temperature between about 220° C.-250° C. for between about 0.5-4 minutes, or between about 1-2 minutes. It should be noted that this soak time is only exemplary and may depend on the solder reflow profile used and the type of processing being carried out in oven 100. In some embodiments, nitrogen flow below the wafer 10 can be continued in steps 450 and 460. The temperature to which the wafer is heated in steps 450 and 460 depends on the reflow profile used. For example, if wafer 10 includes a higher melting temperature solder (such as, for example, gold-tin), a different reflow profile (than FIG. 3) can be used, and the wafer can be heated and maintained at a higher temperature to reflow the solder in steps 450 and 460

In step 470, after the soldering is completed, lamps 82 are turned off (or reduced to a safe idle power), and the wafer 10 is lowered into the cool-down zone 90A of enclosure 66 to cool down the wafer. In some embodiments, the wafer 10 can be physically supported by the cold plate 94 to cool the wafer by conduction. In some embodiments, a liquid coolant can also be circulated through the coolant channels of cold pate 94 to quickly cool the wafer 10. configured to direct a coolant (water or another liquid coolant) therethrough to remove heat conducted from wafer 10. In some embodiments, the underside of the wafer 10 can be positioned proximate the cold plate 94 and nitrogen gas directed to the underside of the wafer via openings 95 (see FIG. 7A) on the cold plate 94 to cool underside of the wafer 10 by forced convection. In some embodiments, when wafer 10 is positioned in the cool-down zone 90A (e.g., seated on or positioned proximate cold plate 94), nitrogen gas (or other suitable inert gas) can be directed into enclosure 66 (e.g., via gas ports 96 on side wall of base 60 of chamber 40) to flow above the wafer 10 and cool the top surface of wafer 10 by convention. In some embodiments, the wafer 10 can be cooled to a temperature between about 15-30° C. in the cool-down zone 90A. In some embodiments, the wafer 10 can be cooled to about the room temperature in the cool-down zone 90A. The cooled wafer 10 can then be raised to the transfer zone 90B of enclosure 66 and removed from the chamber 40 of oven 100.

For wafers and semiconductor devices using small solder bumps (or micro-bumps), and in 3D stacking of semiconductor devices, good coverage of formic acid vapor on the wafer and solder surface can promote effective removal of the surface oxide layers from the solder. A low pressure (i.e., below about 10 Torr) of the enclosure 66 when formic acid vapor is introduced into the enclosure 66 enables the vapor to effectively cover the top surface of the wafer 10 and clean the solder surface. Discharging nitrogen gas (or another inert gas) below the wafer 10 while formic acid vapor is discharged from the top also assists in confining the formic acid vapor primarily on the top surface of the wafer 10. The concentration of the formic acid in the vapor discharged into the enclosure 66 (in step 430) is also controlled for effective cleaning of the surface oxides on the solder. Controlling the diffusion coefficient (or diffusivity) of the formic acid vapor discharged into the enclosure 66 in step 430 can improve oxide cleaning. The diffusivity of the formic acid vapor is improved by controlling the formic acid concentration and the resultant partial pressure of formic acid and temperature dependent gas mobility of the vapor to improve the soak process in step 430. In some embodiments of the current disclosure, the concentration of the formic acid in the formic acid vapor discharged into the enclosure in step 430 can be between about 3-15%. In some embodiments, the formic acid concentration in the vapor can be between about 30-40%. This formic acid concentration can result in the diffusivity of the formic acid vapor to be between about 200-300 $cm^2$/second, and a partial pressure between about 20-40%.

The above-described embodiment of reflow oven 100 and methods of operating the oven are only exemplary. Many variations are possible. Although formic acid vapor is described as the chemical vapor discharged into oven 100 (in step 430), this is only exemplary. Any chemical vapor suitable for the process being carried out in oven 100 can be used. Further, any reflow process can be performed using oven 100 using a time-temperature profile (or reflow profile) suitable for solder material being used. U.S. Patent Application Publication US 2021/0265301, incorporated by reference as if fully set forth herein, describes some exemplary reflow processes that can be performed in oven 100. The steps of methods 200 and 400 need not be performed in the order illustrated in FIGS. 8 and 9. Some steps can be omitted and/or some steps added in other exemplary methods. For example, in some embodiments, lamps 82 can be activated (step 240) before loading wafer into the chamber (i.e., step 210) or before rotating spindle (step 220), etc. As another example, in some embodiments, enclosure 66 of chamber 40 can be pumped down to a sub-atmospheric pressure (e.g., between about 1-10 Torr) loading the wafer into chamber (step 210), etc. Persons of ordinary skill in the art would recognize and understand these possible variations to be within the scope of the present disclosure.

Furthermore, although oven 100 is disclosed in conjunction with a solder reflow process, this is only exemplary. Persons of ordinary skill in the art would recognize that the disclosed oven can be used for any appropriate process. Further, although a wafer bumping process is described, this disclosure is not limited to this application. In general, any high temperature process may be performed in oven 100 on any type of substrate (e.g., wafer, organic/ceramic substrates, semiconductor packages, printed circuit board (PCB), etc.). For example, in some embodiments, oven 100 can be used for attaching dies (or IC chips) on substrates or chip-carriers (PCB, ceramic/organic substrates, etc.) using solder (e.g., reflow soldering). During reflow soldering, solder balls or solder paste (a sticky mixture of powdered solder and flux) can be used to temporarily attach one or more electronic components together (e.g., dies to substrates using C4 joints, die-substrate assembly to package substrate (e.g., PCB) using ball grid array (BGA) joints, etc.). The component assembly can then be subject to a reflow process to melt the solder and attach the components together.

Other embodiments of the oven and related methods will be apparent to those skilled in the art from consideration of the disclosure herein. It should also be noted that, in some embodiments, the functions of one or more of the described zones of the oven 100 (e.g., cool-down zone 90A transfer zone 90B directly above cool-down zone 90A, dosing zone 90C fast ramp zone 90D, etc.) may be combined, thereby reducing the number of zones.

What is claimed is:

1. A method of using a solder reflow oven, comprising:
   disposing at least one substrate including solder in a chamber of the oven;
   decreasing a pressure of the chamber to a first pressure between about 0.1-50 Torr;
   after decreasing the pressure of the chamber, increasing a temperature of the at least one substrate to a first temperature;
   after increasing the temperature, admitting formic acid vapor into the chamber above the at least one substrate while admitting nitrogen gas into the chamber below the at least one substrate;
   removing at least a portion of the formic acid vapor from the chamber;
   after the removing, further increasing the temperature of the at least one substrate to a second temperature higher than the first temperature;
   maintaining the at least one substrate at the second temperature for a first time; and
   after the maintaining, cooling the at least one substrate.

2. The method of claim 1, wherein increasing the temperature includes increasing the temperature of the at least one substrate using a lamp assembly disposed in the chamber above the at least one substrate.

3. The method of claim 1, wherein further increasing the temperature includes further increasing the temperature of the at least one substrate using a lamp assembly disposed in the chamber above the at least one substrate.

4. The method of claim 1, wherein increasing the temperature includes increasing the temperature of the at least one substrate to a temperature between about 150° C.-180° C.

5. The method of claim 4, wherein further increasing the temperature includes further increasing the temperature of the at least one substrate to a temperature between about 220° C.-250° C.

6. The method of claim 1, wherein admitting formic acid vapor into the chamber includes admitting vapor having a concentration of 3-15 wt. % formic acid into the chamber.

7. The method of claim 1, wherein admitting formic acid vapor into the chamber includes directing formic acid vapor into the chamber from a source that is adapted to vary a concentration of formic acid in the formic acid vapor.

8. The method of claim 1, wherein admitting formic acid vapor into the chamber includes directing formic acid vapor into the chamber from a bubbler.

9. The method of claim 1, wherein cooling the at least one substrate includes cooling the at least one substrate to a temperature between about 15° C.-30° C.

10. The method of claim 1, wherein the first time is between about 0.5 minutes to 4 minutes.

11. The method of claim 1, wherein admitting formic acid vapor into the chamber includes admitting formic acid vapor into the chamber while the at least one substrate is rotating in the chamber.

12. The method of claim 1, further including lowering the at least one substrate in the chamber to a dosing zone after increasing the temperature of the at least one substrate and before admitting formic acid vapor into the chamber.

13. The method of claim 1, wherein cooling the at least one substrate includes lowering the at least one substrate in the chamber to contact a cold plate of the chamber.

14. The method of claim 13, further including directing a liquid coolant through the cold plate to assist in cooling the at least one substrate.

15. The method of claim 1, wherein cooling the at least one substrate includes lowering the at least one substrate in the chamber to a cool-down zone of the chamber and directing an inert gas on the at least one substrate to assist in cooling the at least one substrate.

16. The method of claim 1, wherein admitting formic acid vapor into the chamber includes admitting formic acid vapor into the chamber through a chemical delivery tube positioned proximate a top surface of the chamber.

17. The method of claim 16, wherein the chemical delivery tube comprises one of (i) a straight tube that extends from a side of the chamber towards a center of the chamber, (ii) a tube that includes one or more angled portions, or (iii) a T-shaped tube.

18. The method of claim 16, wherein the chemical delivery tube comprises a plurality of gas nozzles configured to direct the formic acid vapor toward a top surface of the at least one substrate.

* * * * *